US006903493B2

(12) United States Patent
Carson et al.

(10) Patent No.: US 6,903,493 B2
(45) Date of Patent: Jun. 7, 2005

(54) INSERTING-FINGER LIQUID METAL RELAY

(75) Inventors: Paul Thomas Carson, Colorado Springs, CO (US); Marvin Glenn Wong, Woodland Park, CO (US)

(73) Assignee: Agilent Technologies, Inc., Palo Alto, CA (US)

(*) Notice: Subject to any disclaimer, the term of this patent is extended or adjusted under 35 U.S.C. 154(b) by 59 days.

(21) Appl. No.: 10/413,187

(22) Filed: Apr. 14, 2003

(65) Prior Publication Data

US 2004/0201320 A1 Oct. 14, 2004

(51) Int. Cl.[7] .......................... H01L 41/08; H01H 29/04

(52) U.S. Cl. ........................ 310/328; 200/214; 200/215

(58) Field of Search .......................... 310/328; 200/214, 200/215

(56) References Cited

U.S. PATENT DOCUMENTS

| | | | | |
|---|---|---|---|---|
| 2,312,672 A | | 3/1943 | Pollard, Jr. | 333/55 |
| 2,564,081 A | | 8/1951 | Schilling | 335/56 |
| 3,177,327 A | * | 4/1965 | Weiss | 200/211 |
| 3,430,020 A | | 2/1969 | Von Tomkewitsch et al. | 156/189 |
| 3,529,268 A | | 9/1970 | Rauterberg | 335/56 |
| 3,600,537 A | | 8/1971 | Twyford | 200/407 |

(Continued)

FOREIGN PATENT DOCUMENTS

| | | |
|---|---|---|
| EP | 0593836 A1 | 10/1992 |
| FR | 2418539 A | 9/1979 |
| FR | 2458138 A1 | 10/1980 |
| FR | 2667396 | 9/1990 |
| JP | SHO 36-18575 | 10/1961 |
| JP | SHO 41-21645 | 10/1972 |
| JP | 63-276838 | 5/1987 |
| JP | 01-294317 | 5/1988 |
| JP | 08-125487 A | 5/1996 |
| JP | 9161640 A | 6/1997 |
| WO | WO 99/46624 A1 | 9/1999 |

OTHER PUBLICATIONS

Bhedwar, Homi C. et al. "Ceramic Multilayer Package Fabrication." Electronic Materials Handbook, Nov. 1989, pp. 460–469, vol. 1 Packaging, Section 4: Packages.

"Integral Power Resistors for Aluminum Substrate," IBM Technical Disclosure Bulletin, US, Jun. 1, 1984, p. 827, vol. 27, No. 1B, TDB–ACC–NO: NB8406827, Cross Reference: 0018–8689–27–1B–827.

Kim, Joonwon et al. "A Micromechanical Switch with Electrostatically Driven Liquid–Metal Droplet." Sensors and Actuators, A: Physical. v 9798, Apr. 1, 2002, 4 pages.

Jonathan Simon, "A Liquid–Filled Microrelay with a Moving Mercury Microdrop" (Sep. 1997) Journal of Microelectromechanical Systems, vol. 6, No. 3, pp208–216.

Marvin Glenn Wong, "A Piezoelectrically Actuated Liquid Metal Switch", May 1, 2002, U.S. Appl. No. 10/137,691, 12 pages of specification, 5 pages of claims, 1 page of abstract, and 10 sheets of drawings (Figs. 1–10).

*Primary Examiner*—Thomas M. Dougherty

(57) ABSTRACT

An electrical relay comprising having two wettable electrical contacts supporting a conducting liquid. A non-wettable switch finger is moved between first and second positions between the electrical contacts by action of an actuator. In the first position the switch finger permits the conducting liquid to bridge the gap between the contacts and complete an electrical circuit between the contacts. In the second position the switch finger separates the conducting liquid into two volumes, breaking the electrical circuit between the contacts. The switch finger may be located at the free end of a beam that is deflected or bent by the action of piezoelectric elements.

22 Claims, 6 Drawing Sheets

U.S. PATENT DOCUMENTS 3,639,165 A 2/1972 Rairden, III ................ 428/433
3,657,647 A 4/1972 Beusman et al. ............. 324/94
4,103,135 A 7/1978 Gomez et al. .............. 200/185
4,200,779 A 4/1980 Zakurdaev et al. ......... 200/187
4,238,748 A 12/1980 Goullin et al. ................ 335/56
4,245,886 A 1/1981 Kolodzey et al. ............. 385/19
4,336,570 A 6/1982 Brower et al. ................. 362/4
4,419,650 A 12/1983 John .......................... 337/119
4,434,337 A 2/1984 Becker ....................... 200/220
4,475,033 A 10/1984 Willemsen et al. ...... 250/201.1
4,505,539 A 3/1985 Auracher et al. ............. 385/19
4,582,391 A 4/1986 Legrand ...................... 385/17
4,628,161 A 12/1986 Thackrey ................. 200/61.47
4,652,710 A 3/1987 Karnowsky et al. ........ 200/235
4,657,339 A 4/1987 Fick ........................... 310/331
4,742,263 A 5/1988 Harnden, Jr. et al. ......... 385/48
4,786,130 A 11/1988 Georgiou et al. ........... 200/226
4,797,519 A 1/1989 Elenbaas ..................... 335/38
4,804,932 A 2/1989 Akanuma et al. ............. 335/38
4,988,157 A 1/1991 Jackel et al. .................. 385/17
5,278,012 A 1/1994 Yamanaka et al. ............ 430/30
5,415,026 A 5/1995 Ford ........................... 73/651
5,502,781 A 3/1996 Li et al. ........................ 385/4
5,644,676 A 7/1997 Blomberg et al. .......... 392/407
5,675,310 A 10/1997 Wojnarowski et al. ........ 372/50
5,677,823 A 10/1997 Smith ......................... 361/234
5,751,074 A 5/1998 Prior et al. ................. 307/118
5,751,552 A 5/1998 Scanlan et al. ............. 361/707
5,828,799 A 10/1998 Donald ........................ 385/16
5,841,686 A 11/1998 Chu et al. ..................... 365/51
5,849,623 A 12/1998 Wojnarowski et al. ...... 438/382
5,874,770 A 2/1999 Saia et al. .................. 257/536
5,875,531 A 3/1999 Nellissen et al. .......... 29/25.35
5,886,407 A 3/1999 Polese et al. ............... 257/706
5,889,325 A 3/1999 Uchida et al. .............. 257/724
5,912,606 A 6/1999 Nathanson et al. ........... 335/47
5,915,050 A 6/1999 Russell et al. ................. 385/7
5,972,737 A 10/1999 Polese et al. ............... 438/122
5,994,750 A 11/1999 Yagi ........................... 257/415
6,021,048 A 2/2000 Smith ......................... 361/736
6,180,873 B1 1/2001 Bitko .......................... 174/9 F
6,201,682 B1 3/2001 Mooij et al. ............. 361/306.1
6,207,234 B1 3/2001 Jiang .......................... 427/333
6,212,308 B1 4/2001 Donald ........................ 385/16
6,225,133 B1 5/2001 Yamamichi et al. ........... 438/3
6,278,541 B1 8/2001 Baker ......................... 359/291
6,304,450 B1 10/2001 Dibene, II et al. .......... 361/704
6,320,994 B1 11/2001 Donald et al. ................ 602/54
6,323,447 B1 11/2001 Kondoh et al.
6,351,579 B1 2/2002 Early et al. ................... 385/18
6,356,679 B1 3/2002 Kapany ....................... 385/18
6,373,356 B1 4/2002 Gutierrez et al.
6,396,012 B1 5/2002 Bloomfield ................. 200/233
6,396,371 B2 5/2002 Streeter et al. ............... 335/78
6,408,112 B1 6/2002 Bartels ........................ 385/16
6,446,317 B1 9/2002 Figueroa et al. ........... 29/29.42
6,453,086 B1 9/2002 Tarazona ..................... 385/20
6,470,106 B2 10/2002 McClelland et al. .......... 385/16
6,487,333 B2 11/2002 Fouquet et al. ............... 385/18
6,501,354 B1 12/2002 Gutierrez et al. ............. 335/47
6,512,322 B1 * 1/2003 Fong et al. ................. 310/328
6,515,404 B1 * 2/2003 Wong ......................... 310/328
6,516,504 B2 2/2003 Schaper ..................... 29/25.42
6,559,420 B1 5/2003 Zarev ......................... 219/209
6,633,213 B1 10/2003 Dove .......................... 335/78
6,730,866 B1 * 5/2004 Wong et al. ................ 200/182
6,740,829 B1 * 5/2004 Wong ......................... 200/214
2002/0037128 A1 3/2002 Burger et al. ................. 385/16
2002/0146197 A1 10/2002 Yong .......................... 385/17
2002/0150323 A1 10/2002 Nishida et al. ............... 385/16
2002/0168133 A1 11/2002 Saito .......................... 385/16
2003/0035611 A1 2/2003 Shi ............................ 385/16
2003/0080650 A1 * 5/2003 Wong et al. ................ 310/328
2003/0205950 A1 * 11/2003 Wong ......................... 310/328
2003/0207102 A1 * 11/2003 Fong et al. ................. 428/328

* cited by examiner

INSERTING-FINGER LIQUID METAL RELAY

CROSS REFERENCE TO RELATED APPLICATIONS

This application is related to the following co-pending U.S. Patent Applications, being identified by the below enumerated identifiers and arranged in alphanumerical order, which have the same ownership as the present application and to that extent are related to the present application and which are hereby incorporated by reference:

Application 10010448-1, titled "Piezoelectrically Actuated Liquid Metal Switch", filed May 2, 2002 and identified by Ser. No. 10/137,691;

Application 10010529-1, "Bending Mode Latching Relay", and having the same filing date as the present application;

Application 10010531-1, "High Frequency Bending Mode Latching Relay", and having the same filing date as the present application;

Application 10010570-1, titled "Piezoelectrically Actuated Liquid Metal Switch", filed May 2, 2002 and identified by Ser. No. 10/142,076;

Application 10010571-1, "High-frequency, Liquid Metal, Latching Relay with Face Contact", and having the same filing date as the present application;

Application 10010572-1, "Liquid Metal, Latching Relay with Face Contact", and having the same filing date as the present application;

Application 10010573-1, "Insertion Type Liquid Metal Latching Relay", and having the same filing date as the present application;

Application 10010617-1, "High-frequency, Liquid Metal, Latching Relay Array", and having the same filing date as the present application;

Application 10010618-1, "Insertion Type Liquid Metal Latching Relay Array", and having the same filing date as the present application;

Application 10010634-1, "Liquid Metal Optical Relay", and having the same filing date as the present application;

Application 10010640-1, titled "A Longitudinal Piezoelectric Optical Latching Relay", filed Oct. 31, 2001 and identified by Ser. No. 09/999,590;

Application 10010643-1, "Shear Mode Liquid Metal Switch", and having the same filing date as the present application;

Application 10010644-1, "Bending Mode Liquid Metal Switch", and having the same filing date as the present application;

Application 10010656-1, titled "A Longitudinal Mode Optical Latching Relay", and having the same filing date as the present application;

Application 10010663-1, "Method and Structure for a Pusher-Mode Piezoelectrically Actuated Liquid Metal Switch", and having the same filing date as the present application;

Application 10010664-1, "Method and Structure for a Pusher-Mode Piezoelectrically Actuated Liquid Metal Optical Switch", and having the same filing date as the present application;

Application 10010790-1, titled "Switch and Production Thereof", filed Dec. 12, 2002 and identified by Ser. No. 10/317,597;

Application 10011055-1, "High Frequency Latching Relay with Bending Switch Bar", and having the same filing date as the present application;

Application 10011056-1, "Latching Relay with Switch Bar", and having the same filing date as the present application;

Application 10011064-1, "High Frequency Push-mode Latching Relay", and having the same filing date as the present application;

Application 10011065-1, "Push-mode Latching Relay", and having the same filing date as the present application;

Application 10011121-1, "Closed Loop Piezoelectric Pump", and having the same filing date as the present application;

Application 10011329-1, titled "Solid Slug Longitudinal Piezoelectric Latching Relay", filed May 2, 2002 and identified by Ser. No. 10/137,692;

Application 10011344-1, "Method and Structure for a Slug Pusher-Mode Piezoelectrically Actuated Liquid Metal Switch", and having the same filing date as the present application;

Application 10011345-1, "Method and Structure for a Slug Assisted Longitudinal Piezoelectrically Actuated Liquid Metal Optical Switch", and having the same filing date as the present application;

Application 10011397-1, "Method and Structure for a Slug Assisted Pusher-Mode Piezoelectrically Actuated Liquid Metal Optical Switch", and having the same filing date as the present application;

Application 10011398-1, "Polymeric Liquid Metal Switch", and having the same filing date as the present application;

Application 10011410-1, "Polymeric Liquid Metal Optical Switch", and having the same filing date as the present application;

Application 10011436-1, "Longitudinal Electromagnetic Latching Optical Relay", and having the same filing date as the present application;

Application 10011437-1, "Longitudinal Electromagnetic Latching Relay", and having the same filing date as the present application;

Application 10011458-1, "Damped Longitudinal Mode Optical Latching Relay", and having the same filing date as the present application;

Application 10011459-1, "Damped Longitudinal Mode Latching Relay", and having the same filing date as the present application;

Application 10020013-1, titled "Switch and Method for Producing the Same", filed Dec. 12, 2002 and identified by Ser. No. 10/317,963;

Application 10020027-1, titled "Piezoelectric Optical Relay", filed Mar. 28, 2002 and identified by Ser. No. 10/109,309;

Application 10020071-1, titled "Electrically Isolated Liquid Metal Micro-Switches for Integrally Shielded Microcircuits", filed Oct. 8, 2002 and identified by Ser. No. 10/266,872;

Application 10020073-1, titled "Piezoelectric Optical Demultiplexing Switch", filed Apr. 10, 2002 and identified by Ser. No. 10/119,503;

Application 10020162-1, titled "Volume Adjustment Apparatus and Method for Use", filed Dec. 12, 2002 and identified by Ser. No. 10/317,293;

Application 10020241-1, "Method and Apparatus for Maintaining a Liquid Metal Switch in a Ready-to-Switch Condition", and having the same filing date as the present application;

Application 10020242-1, titled "A Longitudinal Mode Solid Slug Optical Latching Relay", and having the same filing date as the present application;

Application 10020473-1, titled "Reflecting Wedge Optical Wavelength Multiplexer/Demultiplexer", and having the same filing date as the present application;

Application 10020540-1, "Method and Structure for a Solid Slug Caterpillar Piezoelectric Relay", and having the same filing date as the present application;

Application 10020541-1, titled "Method and Structure for a Solid Slug Caterpillar Piezoelectric Optical Relay", and having the same filing date as the present application;

Application 10030440-1, "Wetting Finger Liquid Metal Latching Relay", and having the same filing date as the present application;

Application 10030521-1, "Pressure Actuated Optical Latching Relay", and having the same filing date as the present application;

Application 10030522-1, "Pressure Actuated Solid Slug Optical Latching Relay", and having the same filing date as the present application; and Application 10030546-1, "Method and Structure for a Slug Caterpillar Piezoelectric Reflective Optical Relay", and having the same filing date as the present application.

FIELD OF THE INVENTION

The invention relates to the field of micro-electromechanical systems (MEMS) for electrical switching, and in particular to an actuated liquid metal relay.

BACKGROUND

Liquid metals, such as mercury, have been used in electrical switches to provide an electrical path between two conductors. An example is a mercury thermostat switch, in which a bimetal strip coil reacts to temperature and alters the angle of an elongated cavity containing mercury. The mercury in the cavity forms a single droplet due to high surface tension. Gravity moves the mercury droplet to the end of the cavity containing electrical contacts or to the other end, depending upon the angle of the cavity. In a manual liquid metal switch, a permanent magnet is used to move a mercury droplet in a cavity.

Liquid metal is also used in relays. A liquid metal droplet can be moved by a variety of techniques, including electrostatic forces, variable geometry due to thermal expansion/contraction and magneto-hydrodynamic forces.

Rapid switching of high currents is used in a large variety of devices, but provides a problem for solid-contact based relays because of arcing when current flow is disrupted. The arcing causes damage to the contacts and degrades their conductivity due to pitting of the electrode surfaces.

Micro-switches have been developed that use liquid metal as the switching element and the expansion of a gas when heated to move the liquid metal and actuate the switching function. Liquid metal has some advantages over other micro-machined technologies, such as the ability to switch relatively high powers (about 100 mW) using metal-to-metal contacts without micro-welding or overheating the switch mechanism. However, the use of heated gas has several disadvantages. It requires a relatively large amount of energy to change the state of the switch, and the heat generated by switching must be dissipated effectively if the switching duty cycle is high. In addition, the actuation rate is relatively slow, the maximum rate being limited to a few hundred Hertz.

SUMMARY

An electrical relay array is disclosed that uses a conducting liquid in the switching mechanism. The relay uses a piezoelectric element to cause a switch finger to prevent or permit the formation of a conducting liquid bridge between two fixed electrical contacts. The relay array is amenable to manufacture by micro-machining techniques.

BRIEF DESCRIPTION OF THE DRAWINGS

The novel features believed characteristic of the invention are set forth in the claims. The invention itself, however, as well as the preferred mode of use, and further objects and advantages thereof, will best be understood by reference to the following detailed description of an illustrative embodiment when read in conjunction with the accompanying drawing(s), wherein:

DETAILED DESCRIPTION

Figure 1:
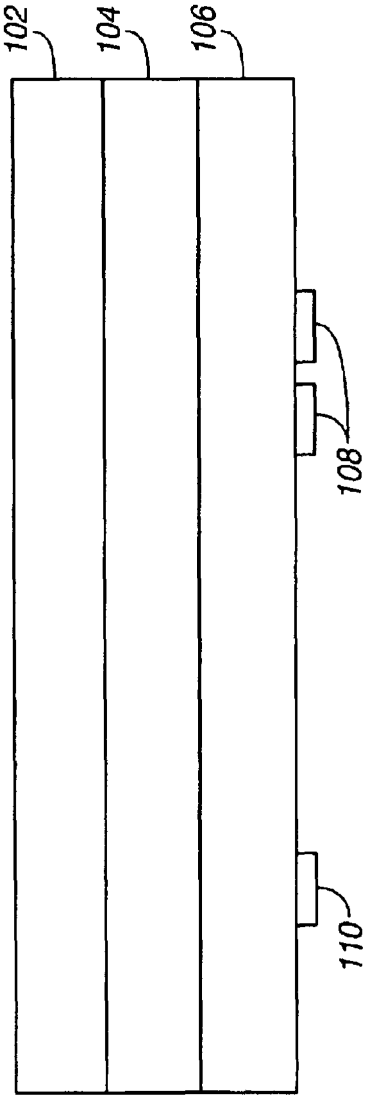
FIG. 1 is a side view of a relay in accordance with certain embodiments of the present invention.

While this invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described. In the description below, like reference numerals are used to describe the same, similar or corresponding parts in the several views of the drawings.

The present invention relates to an electrical relay is which the formation of a conducting liquid bridge between two fixed contacts is prevented or permitted by action of a non-conducting, non-wettable finger. The conducting liquid may be a liquid metal, such as mercury. The finger is attached to one end of a beam, the other end of the beam is fixed to the substrate of the relay. The beam and the attached finger are moved by the action of one or more piezoelectric elements acting on the beam. The piezoelectric elements may operate in bending or extensional modes. Magnetorestrictive actuators, such as Terenol-D, that deform in the presence of a magnetic field may be used as an alternative to piezoelectric actuators. In the sequel, piezoelectric actuators and magnetorestrictive actuators will be collectively referred to as "piezoelectric actuators".

FIG. 1 is a side view of an exemplary embodiment of a relay of the present invention. The relay has three layers: a cap layer 102, a piezoelectric layer 104 and a substrate layer 106. The substrate layer 106 supports electrical connections 108 to the switch, electrical connections 110 to the piezoelectric actuator and the associated circuitry. These three layers form a relay housing.

Figure 2:
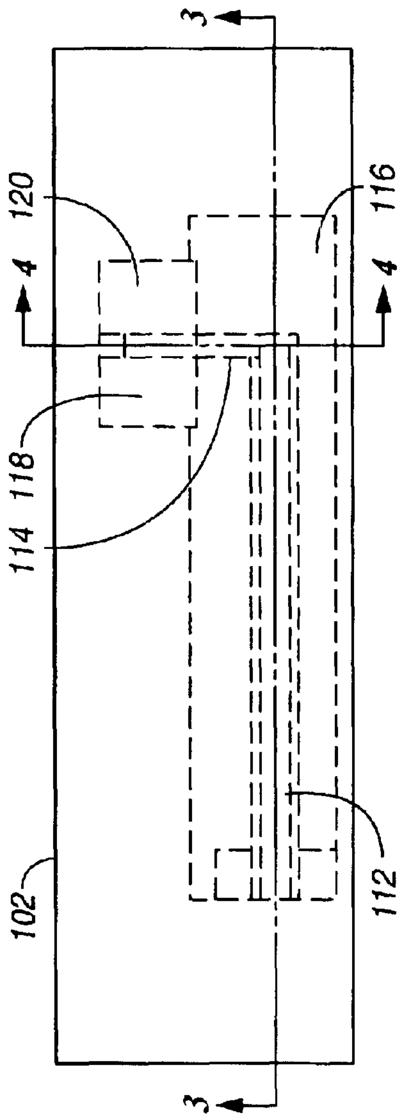
FIG. 2 is a top view of a relay in accordance with certain embodiments of the present invention.

FIG. 2 is a top view of the relay in FIG. 1. The broken lines indicate hidden structure including the moveable beam 112 and the switch finger 114 that is attached to the free end of the beam 112. These elements are positioned within a switching cavity 116 in the piezoelectric layer of the relay. Also shown are two electrical contacts 118 and 120 that have wettable surfaces supporting droplets of conducting liquid. The sections 3—3 and 4—4 will be described below with reference to FIG. 3 and FIG. 4 respectively.

Figure 3:
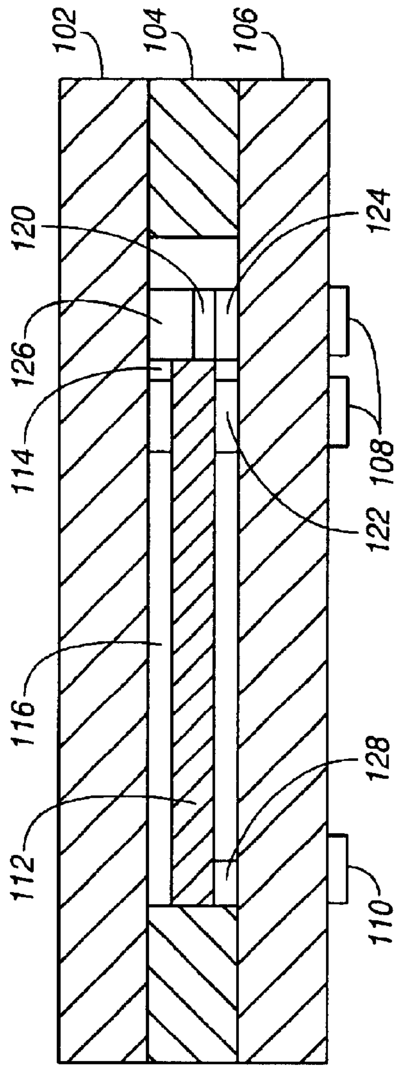
FIG. 3 is a sectional view of a relay in accordance with certain embodiments of the present invention.

FIG. 3 is a sectional view through the section 3-3 in FIG. 2. The moveable beam 112 is fixed at one end to the substrate of the piezoelectric layer 104. The free end of the beam supports the switch finger 114. These elements are positioned within the switching cavity 116. The contact 120 is attached via a non-wettable pad 124 to the substrate 106. The other contact (118 in FIG. 2) is attached via a non-wettable pad 122 to the substrate 106. The electrical contacts are positioned within a recess in the switching cavity. The contacts have a wettable surface that supports a volume of conducting liquid 126. The volume of the conducting liquid is chosen such that the liquid forms a bridge between the contacts, the bridge being maintained by surface tension in the liquid. The contacts are electrically connected to the connectors 108 that allow signal to be routed through the relay. The beam 112 is moved by action of a piezoelectric actuator. Control signals are coupled to the actuator via connectors 110 that are electrically coupled to contact pads 128 in the switching cavity.

Figure 4:
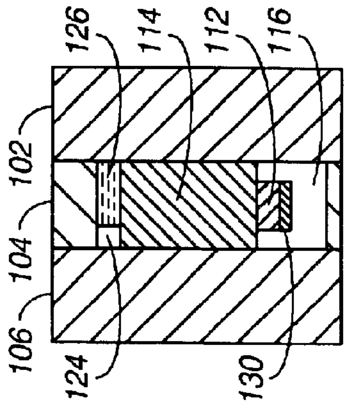
FIG. 4 is a sectional view of a relay in accordance with certain embodiments of the present invention in a closed state.

FIG. 4 is a sectional view through the section 4-4 in FIG. 2. The switch finger 114 is attached to the free end of the moveable beam 112 and is partially inserted into the conducting liquid volume 126. The conducting liquid 126 fills the gap between the two electrical contacts, but does not wet the non-wettable pad 124. In this embodiment, the beam 112 is moved by action of a piezoelectric element 130 attached to the side of the beam and operable to bend the beam.

Figure 5:
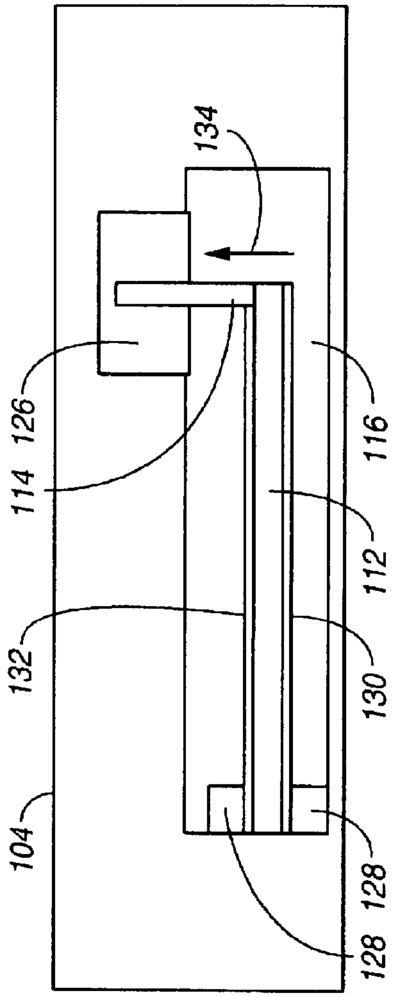
FIG. 5 is a top view of a relay in a closed state in accordance with certain embodiments of the present invention.

FIG. 5 is a top view of a relay with the cap layer 102 removed. The switch is in a closed state, since the liquid metal bridges the gap between the electrical contacts. In this embodiment, the moveable beam 112 is acted upon by one or two piezoelectric elements 130 and 132 attached to the sides of the beam. Extension of the piezoelectric element 130 along the length of the beam or contraction of the piezoelectric element 132 along the length of the beam will cause the beam to bend such that the free end of the beam, and the attached switch finger, moves in the direction indicated by the arrow 134. The piezoelectric elements may be used alone or in concert. Control signals to the piezoelectric elements are provided via contact pads 128.

Figure 6:
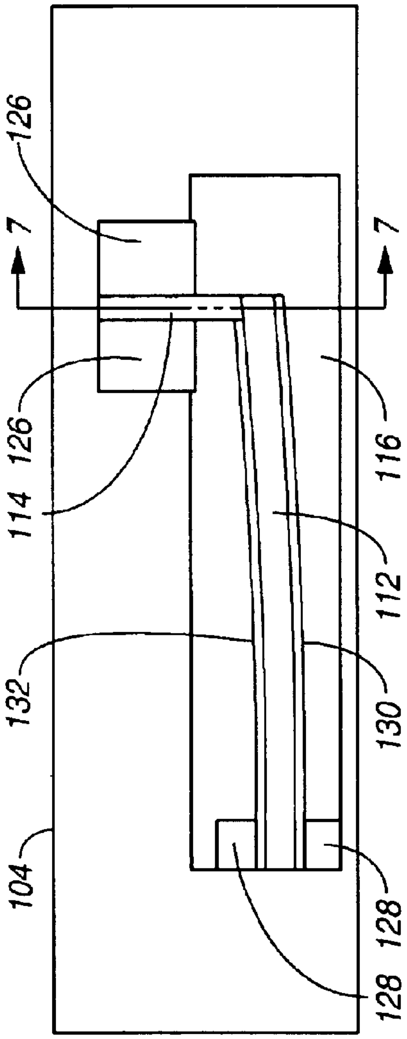
FIG. 6 is a top view of a relay in an open state in accordance with certain embodiments of the present invention.

FIG. 6 is a top view of a relay with the cap layer 102 removed. The switch is in an open state. The beam 112 has been bent by action of the piezoelectric elements 130 and 132, causing the switch finger 114 to insert into the conducting liquid volume 126and to separate the volume into two parts. This breaks the electrical connection between the two electrical contacts and opens the circuit. The switch finger is non-wettable and non-conductive.

Figure 7:
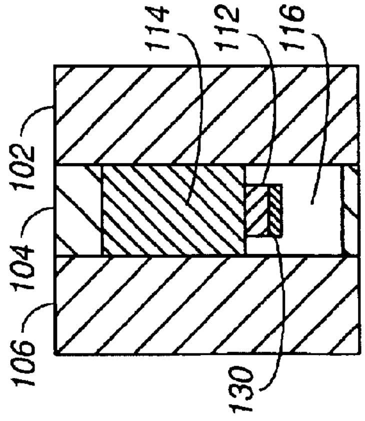
FIG. 7 is a sectional view of a relay in an open state in accordance with certain embodiments of the present invention.

FIG. 7 is sectional view through the section 7—7 in FIG. 6. The free end of the beam 112 has been displaced vertically in the figure relative to its position in FIG. 4. The switch finger 114 has been fully inserted into the conducting liquid volume 126, separating the volume into two parts and breaking the electrical connection.

In this embodiment of the invention, the circuit between the electrical contacts is complete unless the actuator is energized. In a further embodiment of the invention, the switch finger separates the conducting liquid volume when the piezoelectric actuator in not energized, and is partially withdrawn when the actuator is energized to complete the electrical circuit. In this further embodiment, the circuit between the electrical contacts is broken unless the actuator is energized.

Figure 8:
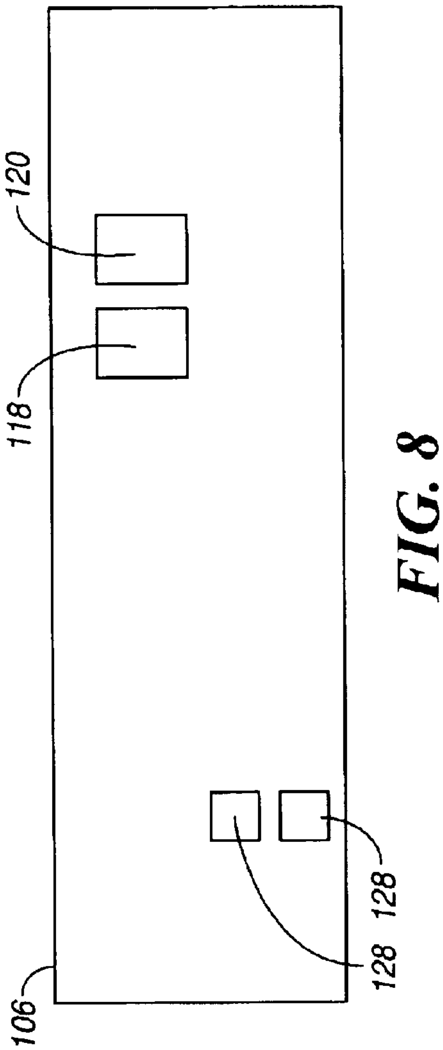
FIG. 8 is a top view of a circuit substrate of a relay in accordance with certain embodiments of the present invention.

FIG. 8 is a top view of a substrate layer 106 of a relay. Two electrical contacts 118 and 120 are fixed to non-wettable pads that are in turn fixed to the substrate 106. Electrical pads 128 provide electrical connections to the piezoelectric elements. The pads and contacts may be formed on the substrate using known micro-machining techniques.

Figure 9:
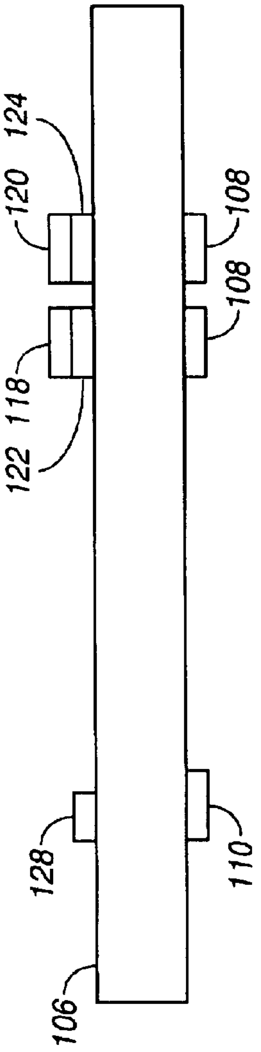
FIG. 9 is a side view of a circuit substrate of a relay in accordance with certain embodiments of the present invention.

A side view of the circuit substrate is shown in FIG. 9. The electrical contacts 118 and 120 are fixed to non-wettable pads 122 and 124, respectively, which are in turn fixed to the substrate 106. The electrical contacts 118 and 120 are electrically coupled to connectors 108 on the external surface of the substrate. Alternatively, the electrical connectors may be connected, via traces on the top of the substrate, to connectors on the edge of the substrate. The electrical pads 128 provide electrical connections to the piezoelectric elements and are electrically coupled to the connectors 110 on the external surface of the substrate.

Figure 10:
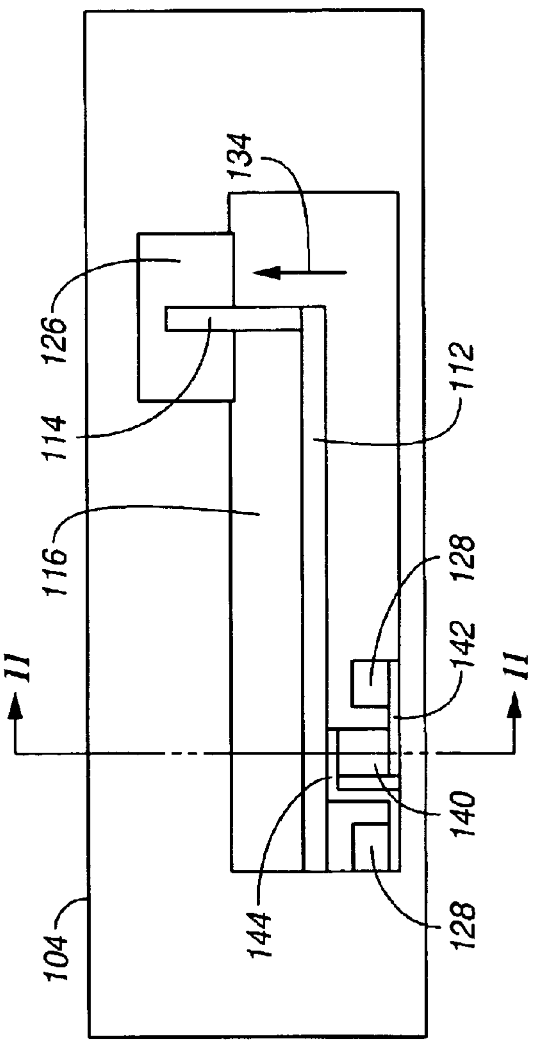
FIG. 10 is a top view of a relay in a closed state in accordance with certain embodiments of the present invention.

FIG. 10 is a top view of an alternative embodiment of the relay with the cap layer 102 removed. The switch is in a closed state. In this embodiment, the moveable beam 112 is acted upon by a piezoelectric actuator 140 attached to a side of the switching channel 116. Extension of the piezoelectric element 140 in the plane of the layer and perpendicular to the beam moves the beam in the direction indicated by the arrow 134. In this embodiment, the piezoelectric actuator is positioned closer to the fixed end of the beam than to the free end. In this configuration, the beam amplifies the motion of the piezoelectric element, thereby producing a larger displacement of the switch finger 114. Other forms of mechanical amplification may be used. Control signals are supplied to the piezoelectric element via the pads 128 and the contacts 142 and 144. The piezoelectric actuator 140 may comprise a single piezoelectric element or a stack of piezoelectric elements.

Figure 11:
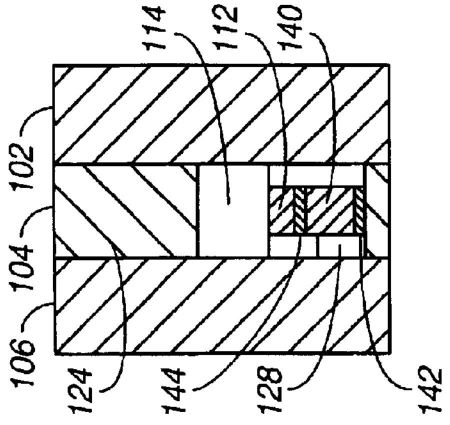
FIG. 11 is a sectional view of a relay in accordance with certain embodiments of the present invention.

FIG. 11 is a sectional view through the section 11-11 in FIG. 10. The piezoelectric element 140 is coupled via the contact 142 to the substrate 104, and via the contact 144 to the beam 112. When a voltage is applied across the piezoelectric element it deforms in an extensional mode (the vertical direction in the figure) and acts laterally on the beam 112. This, in turn, moves the switch finger 114.

Figure 12:
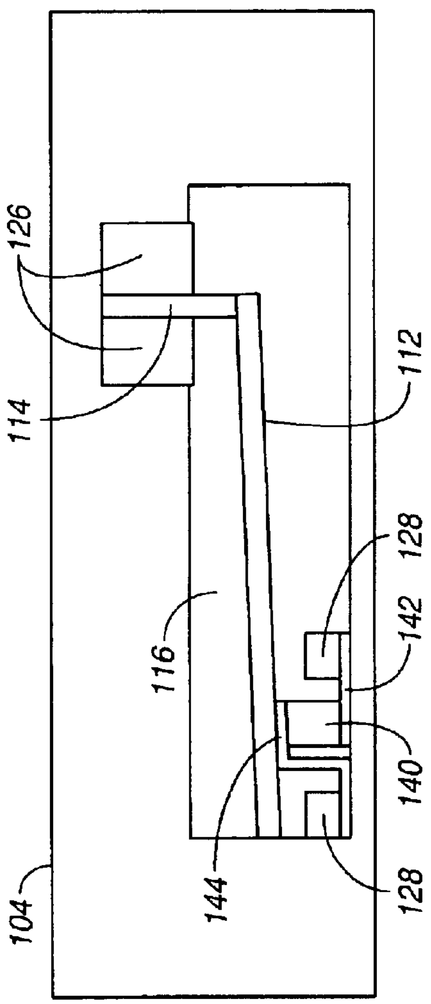
FIG. 12 is a top view of a relay in an open state in accordance with certain embodiments of the present invention.

FIG. 12 is a top view of the relay in FIG. 10 showing the switch is in an open state. The piezoelectric element 140 has been energized and displaces the beam 112 laterally. This has moved the switch finger 114 into to volume of conducting fluid 126, separating it into two volumes and breaking the electrical circuit between the electrical contacts.

Figure 13:
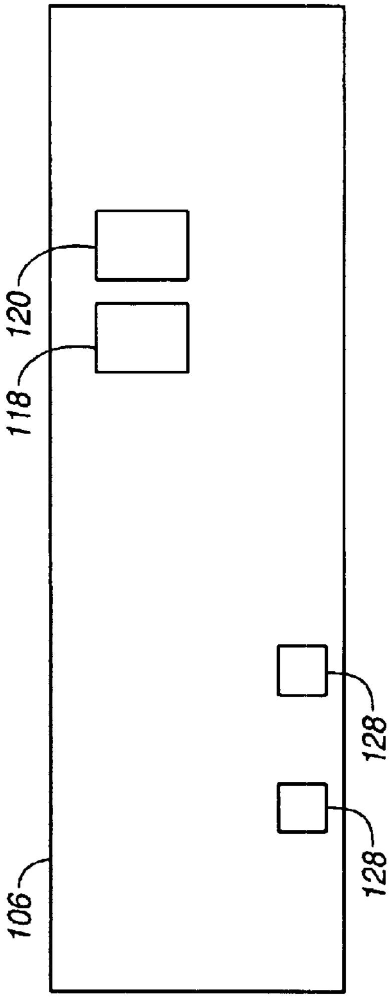
FIG. 13 is a top view of a circuit substrate of a relay in accordance with certain embodiments of the present invention.

FIG. 13 is a top view of a substrate layer 106 of the relay shown in FIGS. 10, 11 and 12. Two electrical contacts 118 and 120 are fixed to non-wettable pads that are in turn fixed to the substrate 106. Electrical pads 128 provide electrical connections to the two ends of the piezoelectric element. The pads and contacts may be formed on the substrate using known micro-machining techniques.

While the invention has been described in conjunction with specific embodiments, it is evident that many alternatives, modifications, permutations and variations will become apparent to those of ordinary skill in the art in light of the foregoing description. Accordingly, the present invention is intended to embrace all such alternatives, modifications and variations as fall within the scope of the appended claims.

What is claimed is:

1. An electrical relay comprising:

a relay housing enclosing a switching cavity;

a first electrical contact in the switching cavity, having a wettable surface;

a second electrical contact in the switching cavity spaced from the first electrical contact and having a wettable surface;

a conducting liquid in wetted contact with the first and second electrical contacts;

a beam having a fixed end attached to the relay housing within the switching cavity and a free end;

a non-wettable switch finger, attached to the free end of the beam and moveable between the first and second electrical contacts; and a piezoelectric actuator operable to move the beam in a lateral direction to cause the switching finger to move between a first position and second position;

wherein when the switch finger is in the first position, the conducting liquid bridges the space between the first and second contacts and completes an electrical circuit between the first and second contacts and when in the second position the switch finger separates the conducting liquid into two volumes, thereby breaking the electrical circuit between the first and second contacts.

2. An electrical relay in accordance with claim 1, wherein the switch finger is in the first position when the piezoelectric actuator is energized and in the second position when the piezoelectric actuator is not energized.

3. An electrical relay in accordance with claim 1, wherein the switch finger is in the second position when the piezoelectric actuator is energized and in the first position when the piezoelectric actuator is not energized.

4. An electrical relay in accordance with claim 1, further comprising:

a first non-wettable pad positioned between the first electrical contacts and the relay housing; and a second non-wettable pad positioned between the second electrical contacts and the relay housing.

5. An electrical relay in accordance with claim 1, wherein the piezoelectric actuator comprises a first piezoelectric element attached to a first side of the beam, the first piezoelectric element operable to deform in a longitudinal mode parallel to the beam and thereby bend the beam.

6. An electrical relay in accordance with claim 5, wherein the piezoelectric actuator further comprises a second piezoelectric element attached to a second side of the beam, the second piezoelectric element operable to deform in a longitudinal mode parallel to the beam and thereby bend the beam, wherein the first piezoelectric element is contracted to bend the beam and the second piezoelectric element is extended to bend the beam.

7. An electrical relay in accordance with claim 1, wherein the piezoelectric actuator comprises a piezoelectric element acting between a wall of the switching cavity and a region of the beam between the free end and the fixed end, the piezoelectric element operable to deform in an extensional mode substantially perpendicular to the beam and thereby deflect the beam.

8. An electrical relay in accordance with claim 7, wherein the region of the beam acted upon by the piezoelectric element is closer to the fixed end of the beam than to the free end.

9. An electrical relay in accordance with claim 1, wherein the piezoelectric actuator comprises a stack of piezoelectric elements acting between a wall of the switching cavity and a region of the beam between the free end and the fixed end, the stack of piezoelectric element operable to deform in an extensional mode substantially perpendicular to the beam and thereby deflect the beam.

10. An electrical relay in accordance with claim 1, wherein the first and second electrical contacts are positioned within a recess in the switching cavity, the recess tending to retain the conducting liquid.

11. An electrical relay in accordance with claim 1, wherein the conducting liquid is a liquid metal.

12. An electrical relay in accordance with claim 1, wherein the relay housing comprises:

a substrate layer supporting electrical connections to the first and second electrical contacts and the piezoelectric actuator;

a cap layer; and a piezoelectric layer positioned between the substrate layer and the cap layer and having the switching cavity formed therein.

13. A method for switching an electrical circuit formed by a bridge of conducting liquid between a first wettable contact and a second wettable contact in an electrical relay, the method comprising:

energizing an actuator to move a non-wettable finger between a first position in which the bridge of conducting liquid is complete and a second position in which the bridge of conducting liquid is broken by the non-wettable finger, wherein the relay includes a beam having a fixed end and a free end, the non-wettable finger being attached to the free end of the beam, and wherein energizing the actuator comprises:

energizing a piezoelectric actuator attached to a side of the beam to deform in a longitudinal direction along the length of the beam, thereby bending the beam and moving the non-wettable finger.

14. A method in accordance with claim 13, wherein energizing the actuator moves the switch finger from the first position to the second position.

15. A method in accordance with claim 13, wherein energizing the actuator moves the switch finger from the second position to the first position.

16. A method for switching an electrical circuit formed by a bridge of conducting liquid between a first wettable contact and a second wettable contact in an electrical relay, the method comprising:

energizing an actuator to move a non-wettable finger between a first position in which the bridge of conducting liquid is complete and a second position in which the bridge of conducting liquid is broken by the non-wettable finger, wherein the relay includes a beam having a fixed end and a free end, the non-wettable finger being attached to the free end of the beam, and wherein energizing the actuator comprises:

energizing a first piezoelectric actuator attached to a first side of the beam to extend in a longitudinal direction along the length of the beam; and energizing a second piezoelectric actuator attached to a second side of the beam to contract in a longitudinal direction along the length of the beam, thereby bending the beam and moving the non-wettable finger.

17. A method in accordance with claim 16, wherein energizing the actuator moves the switch finger from the first position to the second position.

18. A method in accordance with claim 16, wherein energizing the actuator moves the switch finger from the second position to the first position.

19. A method for switching an electrical circuit formed by a bridge of conducting liquid between a first wettable contact and a second wettable contact in an electrical relay, the method comprising:

energizing an actuator to move a non-wettable finger between a first position in which the bridge of conducting liquid is complete and a second position in which the bridge of conducting liquid is broken by the non-wettable finger, wherein the relay includes a beam having a fixed end and a free end, the non-wettable finger being attached to the free end of the beam, and wherein energizing the actuator comprises:

energizing a piezoelectric actuator in contact with the beam and a housing of the relay to deform in direction substantially perpendicular to the length of the beam, thereby deflecting the beam and moving the non-wettable finger.

20. A method in accordance with claim 19, wherein the piezoelectric actuator contacts the beam in a region closer to the fixed end than to the free end so as to amplify the motion of the piezoelectric actuator.

21. A method in accordance with claim 19, wherein energizing the actuator moves the switch finger from the first position to the second position.

22. A method in accordance with claim 19, wherein energizing the actuator moves the switch finger from the second position to the first position.

* * * * *

UNITED STATES PATENT AND TRADEMARK OFFICE

CERTIFICATE OF CORRECTION

PATENT NO. : 6,903,493 B2
DATED : June 7, 2005
INVENTOR(S) : Carson et al.

It is certified that error appears in the above-identified patent and that said Letters Patent is hereby corrected as shown below:

Title page,
Item [56], References Cited, FOREIGN PATENT DOCUMENTS,
delete "SHO 41-21645" and insert -- SHO 47-21645 --.
OTHER PUBLICATIONS,
"Integral Power Resistors for Aluminum Substrate," reference, after "Substrate" delete "," and insert -- . --.

Column 10,
Line 12, after "deform in" insert -- a --.

Signed and Sealed this

Twenty-first Day of February, 2006

JON W. DUDAS
*Director of the United States Patent and Trademark Office*